United States Patent
Lin et al.

(10) Patent No.: US 9,692,368 B2
(45) Date of Patent: Jun. 27, 2017

(54) DUAL-BAND LOW NOISE AMPLIFIER

(71) Applicant: QUALCOMM Incorporated, San Diego, CA (US)

(72) Inventors: Saihua Lin, Santa Clara, CA (US); Anup Savla, Santa Clara, CA (US); Mounir Youssef Bohsali, Alamo, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/481,251

(22) Filed: Sep. 9, 2014

(65) Prior Publication Data

US 2016/0072456 A1    Mar. 10, 2016

(51) Int. Cl.
| | |
|---|---|
| H03F 3/191 | (2006.01) |
| H03F 1/56 | (2006.01) |
| H03F 1/22 | (2006.01) |
| H03F 1/26 | (2006.01) |

(52) U.S. Cl.
CPC ............ *H03F 3/191* (2013.01); *H03F 1/223* (2013.01); *H03F 1/26* (2013.01); *H03F 1/565* (2013.01); *H03F 2200/108* (2013.01); *H03F 2200/111* (2013.01); *H03F 2200/171* (2013.01); *H03F 2200/222* (2013.01); *H03F 2200/294* (2013.01); *H03F 2200/372* (2013.01); *H03F 2200/378* (2013.01); *H03F 2200/391* (2013.01); *H03F 2200/541* (2013.01); *H03F 2200/546* (2013.01)

(58) Field of Classification Search
CPC .................................. H03H 11/1243
USPC ................................. 330/302, 306
See application file for complete search history.

(56) References Cited

U.S. PATENT DOCUMENTS

| | | | |
|---|---|---|---|
| 4,277,756 A | 7/1981 | Kriedt et al. | |
| 6,674,337 B2 | 1/2004 | Hashemi et al. | |
| 7,167,044 B2 | 1/2007 | Li et al. | |
| 7,224,225 B2 | 5/2007 | Chang | |
| 7,323,939 B2* | 1/2008 | Han | H03F 1/223 330/305 |
| 7,408,409 B2 | 8/2008 | Kern | |
| 7,714,663 B2 | 5/2010 | Gong et al. | |
| 7,786,806 B2 | 8/2010 | Duperray | |
| 7,944,305 B2 | 5/2011 | Knickerbocker et al. | |
| 8,294,520 B2 | 10/2012 | Borremans | |
| 8,306,494 B2* | 11/2012 | Ojo | H03F 1/223 330/261 |
| 8,659,473 B2 | 2/2014 | Bauwelinck et al. | |

(Continued)

FOREIGN PATENT DOCUMENTS

EP       2127069       4/2012

OTHER PUBLICATIONS

International Search Report and Written Opinion—PCT/US2015/044902—ISA/EPO—Sep. 21, 2015, 10 pages.

*Primary Examiner* — Khanh V Nguyen
*Assistant Examiner* — Khiem Nguyen
(74) *Attorney, Agent, or Firm* — Qualcomm Incorporated-Toler (57) ABSTRACT

An apparatus includes amplification circuitry configured to amplify a radio frequency (RF) signal. The apparatus also includes differential inductors coupled to an output of the amplification circuitry. The differential inductors include a first inductor serially coupled to a second inductor, and the differential inductors are configured to filter the RF signal and to provide a differential output.

17 Claims, 5 Drawing Sheets

(56) References Cited

U.S. PATENT DOCUMENTS

| | | |
|---|---|---|
| 2008/0258817 A1 | 10/2008 | Zhou et al. |
| 2009/0103652 A1 | 4/2009 | Mabuchi et al. |
| 2011/0102088 A1* | 5/2011 | Rajendran ............... H03F 1/223 |
| | | 330/277 |
| 2013/0033312 A1 | 2/2013 | Lu |

* cited by examiner

DUAL-BAND LOW NOISE AMPLIFIER

I. FIELD

The present disclosure is generally related to a dual-band low noise amplifier.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless devices may include multiple low noise amplifiers to receive signals over multiple frequency bands. For example, a first low noise amplifier may be configurable to receive signals over a first frequency band (e.g., a 2.4 Gigahertz (GHz) band). Additionally, a second low noise amplifier may be configurable to receive signals over a second frequency band (e.g., a 5.6 GHz band). Using multiple low noise amplifiers for multi-band reception (e.g., dual-band reception) may increase die area. For example, a transistor core for each low noise amplifier may be relatively large (e.g., in the millimeter (mm) range), which may increase the chip size, die area, and cost of the low noise amplifiers. In addition, Institute of Electrical and Electronics Engineers (IEEE) 802.11 ("WiFi") standards for wireless local area networks (WLANs) may be supported by first frequency band and the second frequency band. However, inter-band interference from simultaneous received multi-band signals may decrease throughput for the WLANs.

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
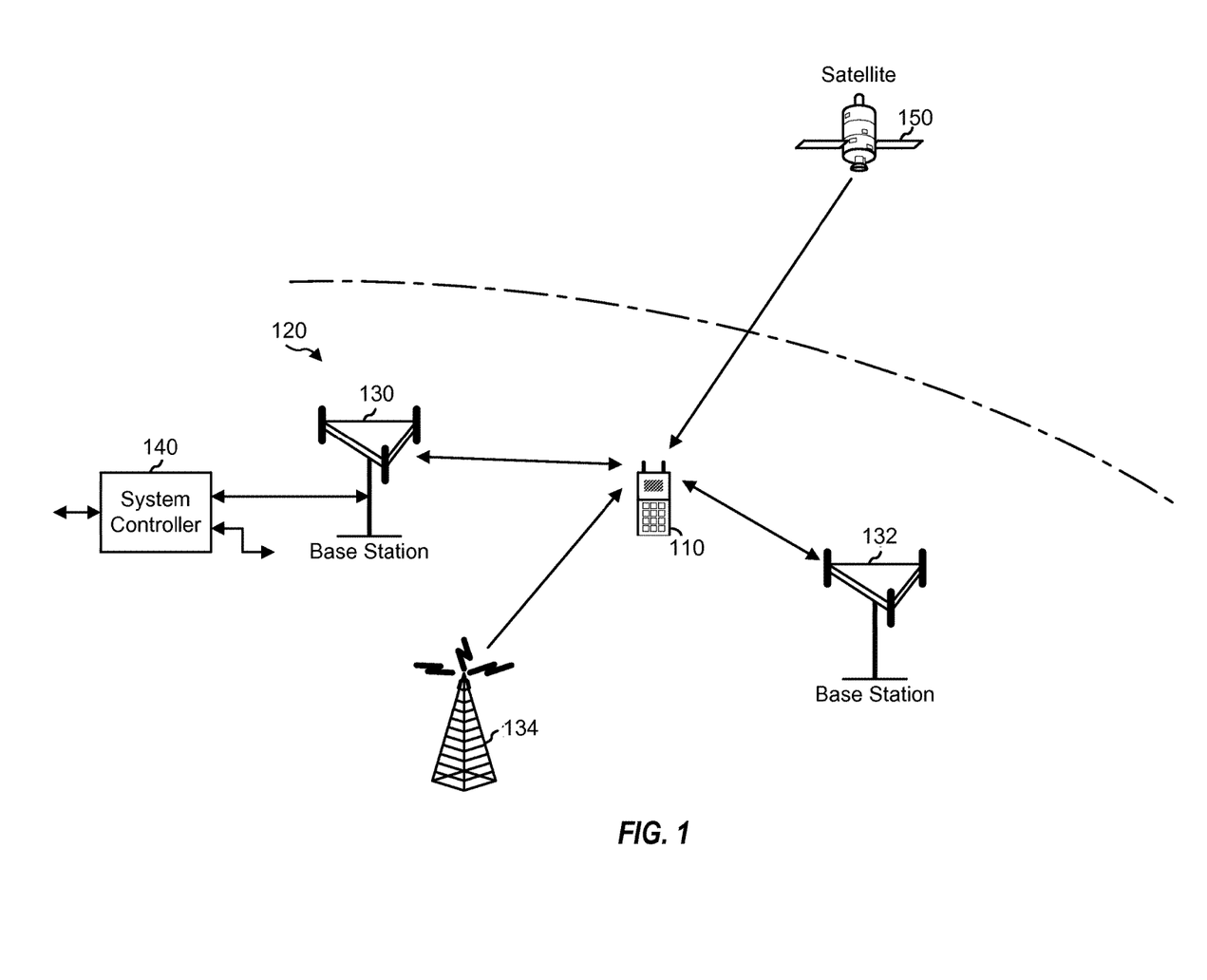
FIG. 1 shows a wireless device communicating with a wireless system.

FIG. 1 shows a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

The wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may communicate with wireless system 120. The wireless device 110 may also receive signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, WCDMA, CDMA 1x, EVDO, TD-SCDMA, GSM, 802.11, etc.

Figure 2:
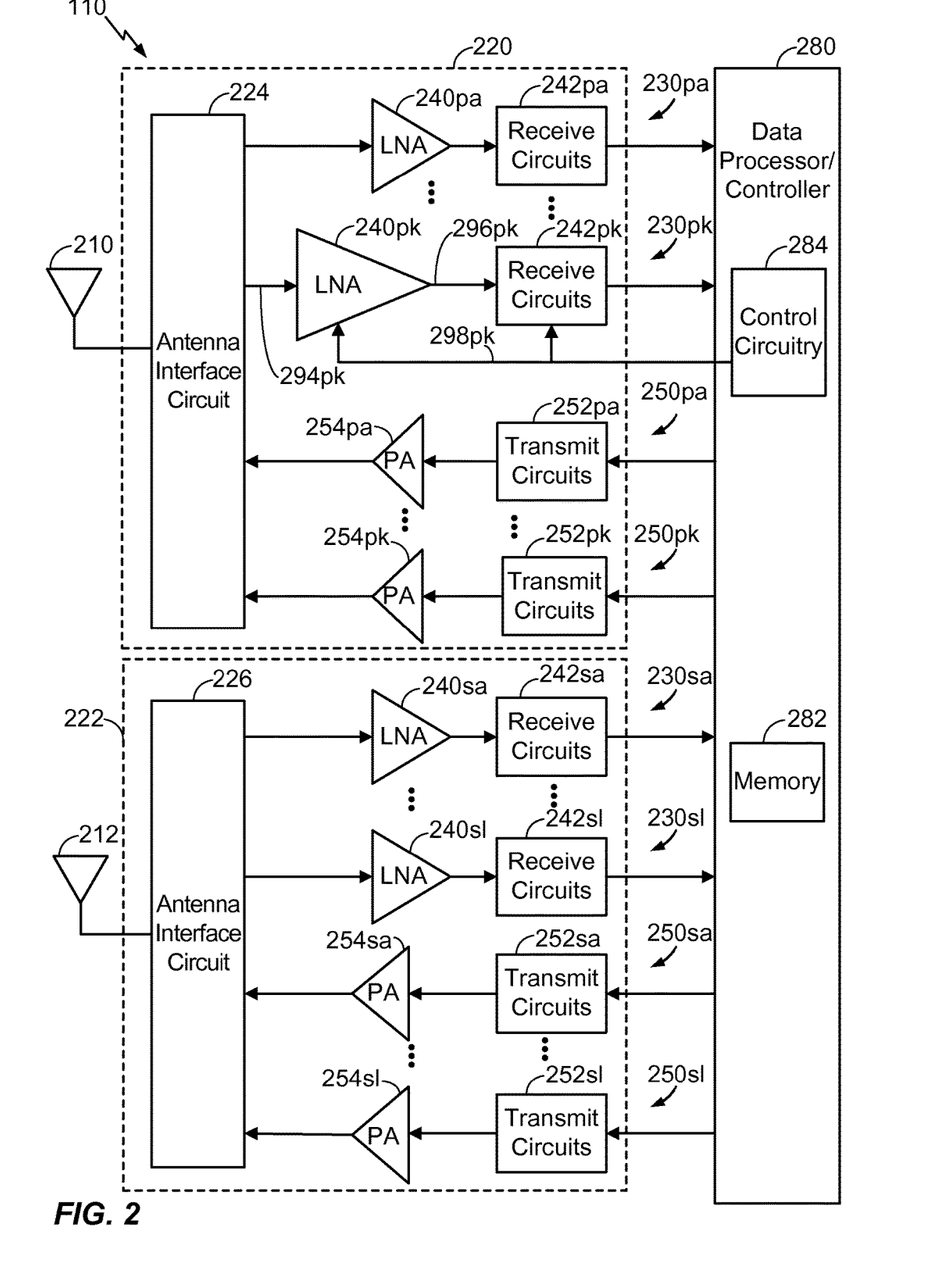
FIG. 2 shows a block diagram of the wireless device in FIG. 1.

FIG. 2 shows a block diagram of an exemplary design of the wireless device 110 in FIG. 1. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230*pa* to 230*pk* and multiple (K) transmitters 250*pa* to 250*pk* to support multiple frequency bands, multiple radio technologies, carrier aggregation, etc. The transceiver 222 includes multiple (L) receivers 230*sa* to 230*sl* and multiple (L) transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230*pa* to 230*pk* and 230*sa* to 230*sl* includes a dual-band LNA 240*pa* to 240*pk* and 240*sa* to 240*sl* and a receive circuit 242*pa* to 242*pk* and 242*sa* to 242*sl*, respectively. For data reception, the primary antenna 210 receives signals from base stations and/or other transmitter stations and provides a received RF signal, which is routed through an antenna interface circuit 224 and presented as an input RF signal 294*pk* to a selected receiver (e.g., the receiver 230*pk*). In a similar manner, the secondary antenna 212 receives signals from base stations and/or other transmitter stations and provides a received RF signal, which is routed through an antenna interface circuit 226 and presented an input RF signal to a selected receiver.

In an exemplary embodiment, the input RF signal 294*pk* may be a multi-band signal having signal components in a first frequency band (e.g., a 2.4 Gigahertz (GHz) frequency band) and/or signal components in a second frequency band (e.g., a 5.6 GHz frequency band). The antenna interface circuit 224 may include switches, duplexers, transmit filters, receive filters, matching circuits, etc. The description below assumes that the receiver 230*pk* is the selected receiver. Within the receiver 230*pk*, an LNA 240*pk* amplifies the input RF signal 294*pk* and provides an output RF signal 296*pk*. For example, the LNA 240*pk* may amplify the input RF signal 294*pk*.

The receive circuits 242*pk* may downconvert the output RF signal 296*pk* from RF to baseband, amplify and filter the downconverted signal, and provide an analog input signal to the data processor/controller 280. The receive circuits 242*pk* may include mixers, filters, amplifiers, matching circuits, an oscillator, a local oscillator (LO) generator, a phase locked loop (PLL), etc. Each remaining receiver 230*pa*, 230*sa*, 230*sl* in the transceivers 220, 222 may operate in similar manner as the receiver 230*pk*.

In the exemplary design shown in FIG. 2, each transmitter 250*pa* to 250*pk* and 250*sa* to 250*sl* includes a transmit circuit 252*pa* to 252*pk* and 252*sa* to 252*sl* and a power amplifier (PA) 254*pa* to 254*pk* and 254*sa* to 254*sl*, respectively. For data transmission, the data processor/controller 280 processes (e.g., encodes and modulates) data to be transmitted and provides an analog output signal to a selected transmitter. The description below assumes that the transmitter 250*pa* is the selected transmitter. Within transmitter 250*pa*, the transmit circuits 252*pa* amplify, filter, and upconvert the analog output signal from baseband to RF and provide a modulated RF signal. The transmit circuits 252*pa* may include amplifiers, filters, mixers, matching circuits, an oscillator, an LO generator, a PLL, etc. A PA 254*pa* receives and amplifies the modulated RF signal and provides a transmit RF signal having the proper output power level. The transmit RF signal is routed through the antenna interface circuit 224 and transmitted via the primary antenna 210. Each remaining transmitter 250*pk*, 250*sa*, 25*sl* in the transceivers 220, 222 may operate in similar manner as the transmitter 250*pa*.

FIG. 2 shows an exemplary design of receivers 230*pa* to 230*pk* and 230*sa* to 230*sl* and transmitters 250*pa* to 250*pk* and 250*sa* to 250*sl*. A receiver and a transmitter may also include other circuits not shown in FIG. 2, such as filters, matching circuits, etc. All or a portion of the transceivers 220 and 222 may be implemented on one or more analog integrated circuits (ICs), RF ICs (RFICs), mixed-signal ICs, etc. For example, LNAs 240*pa* to 240*pk* and 240*sa* to 240*sl* and receive circuits 242*pa* to 242*pk* and 242*sa* to 242*sl* may be implemented on one module, which may be an RFIC, etc. The circuits in the transceivers 220 and 222 may also be implemented in other manners.

Figure 3:
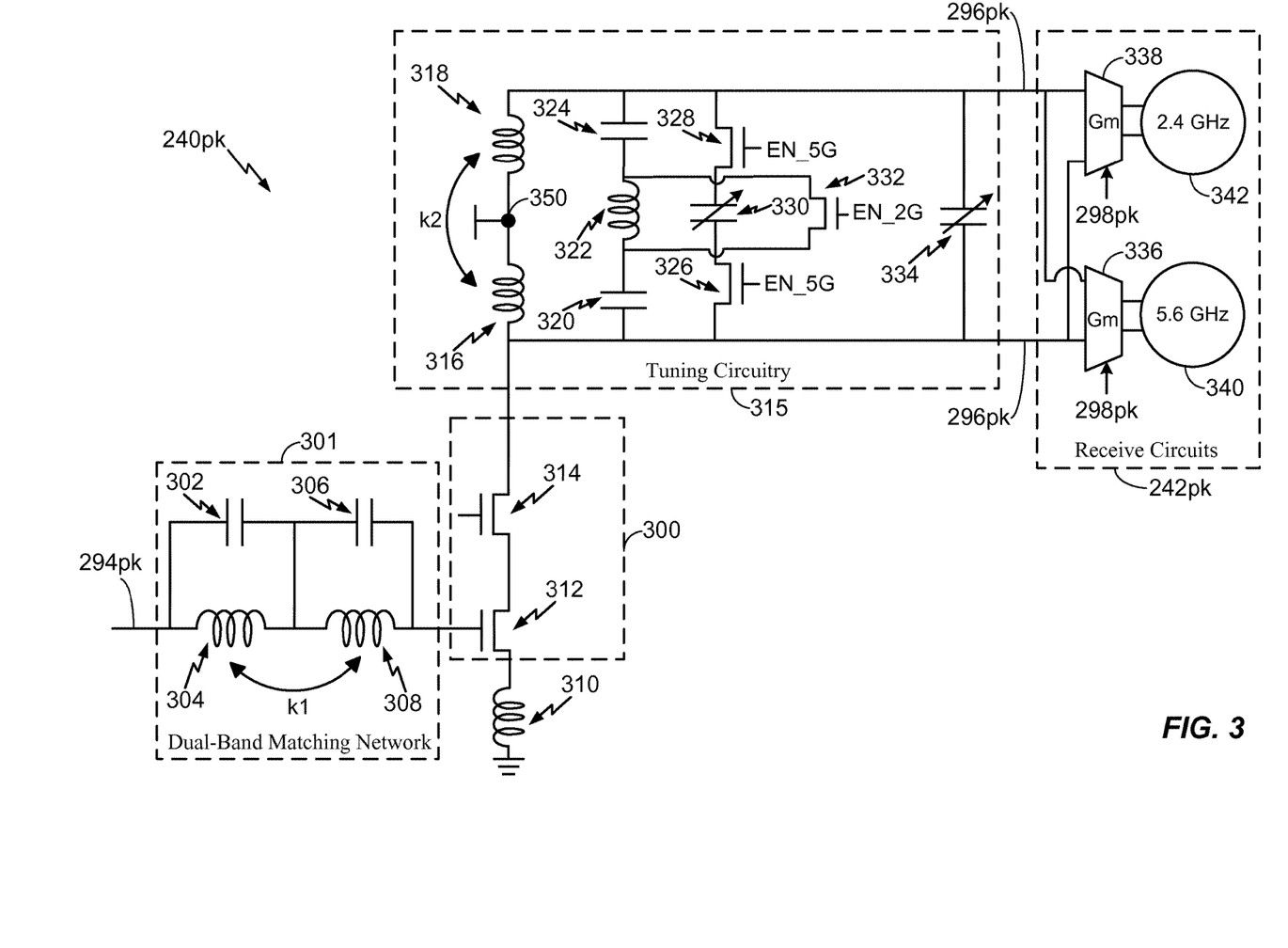
FIG. 3 is a diagram that depicts an exemplary embodiment of a dual-band low noise amplifier that is operable to operate in multiple modes.

In an exemplary embodiment, one or more of the multi-band LNAs 240*pa* to 240*pk* and 240*sa* to 240*sl* may receive a control signal (e.g., control signal 298*pk*) from control circuitry 284 in the data processor/controller 280 to operate the corresponding dual-band LNA (e.g., the LNA 240*pk*) in the first frequency band (e.g., the 2.4 GHz frequency band), the second frequency band (e.g., the 5.6 GHz frequency band), or a combination thereof in a simultaneous dual-band mode, as further described with respect to FIG. 3.

The data processor/controller 280 may perform various functions for wireless device 110. For example, the data processor/controller 280 may perform processing for data being received via the receivers 230*pa* to 230*pk* and 230*sa* to 230*sl* and data being transmitted via the transmitters 250*pa* to 250*pk* and 250*sa* to 250*sl*. The data processor/controller 280 may control the operation of the various circuits within transceivers 220 and 222. For example, the data processor/controller 280 may include the control circuitry 284 to operate a dual-band LNA (e.g., the LNA 240*pk*) in the first frequency band (e.g., the 2.4 GHz frequency band), the second frequency band (e.g., the 5.6 GHz frequency band), or a combination thereof in a simultaneous dual-band mode, as further described with respect to FIG. 3. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

Referring to FIG. 3, a diagram of an exemplary embodiment of the dual-band low noise amplifier 240*pk* is shown. FIG. 3 also illustrates components of the receive circuits 242*pk* that are coupled to receive the output RF signal 296*pk* from the LNA 240*pk*.

The LNA 240*pk* may include a dual-band matching network 301 coupled to amplification circuitry 300. The amplification circuitry 300 may include a pair of cascoded transistors 312, 314. An input of the dual-band matching network 301 may be configured to receive the input RF signal 294*pk* of FIG. 2. The input RF signal 294*pk* may include first signal components within a first frequency band (e.g., a 2.4 GHz frequency band) and second signal components within a second frequency band (e.g., a 5.6 GHz frequency band).

The dual-band matching network 301 may be an inductive-capacitive (LC) network. For example, the dual-band matching network 301 may include a capacitor 302, an inductor 304, a capacitor 306, and an inductor 308. A first terminal of the capacitor 302 and a first terminal of the inductor 304 may be coupled to receive the input RF signal 294*pk*. A second terminal of the capacitor 302 may be coupled to a second terminal of the inductor 304 such that the capacitor 302 and the inductor 304 are coupled in parallel. A first terminal of the capacitor 306 may be coupled to the second terminal of the capacitor 302, and a first terminal of the inductor 308 may be coupled to the second terminal of the inductor 304. A second terminal of the capacitor 306 and a second terminal of the inductor 308 may be coupled to the amplification circuitry 300 such that the capacitor 306 and the inductor 308 are coupled in parallel.

The inductor 304 may be inductively coupled to the inductor 308 by a coupling coefficient (k1) (e.g., a coupling factor). The coupling coefficient (k1) may be a fractional number that is greater than "0" and less than or equal to "1", where "0" indicates no inductive coupling and "1" indicates full (or maximum) inductive coupling.

Figure 4:
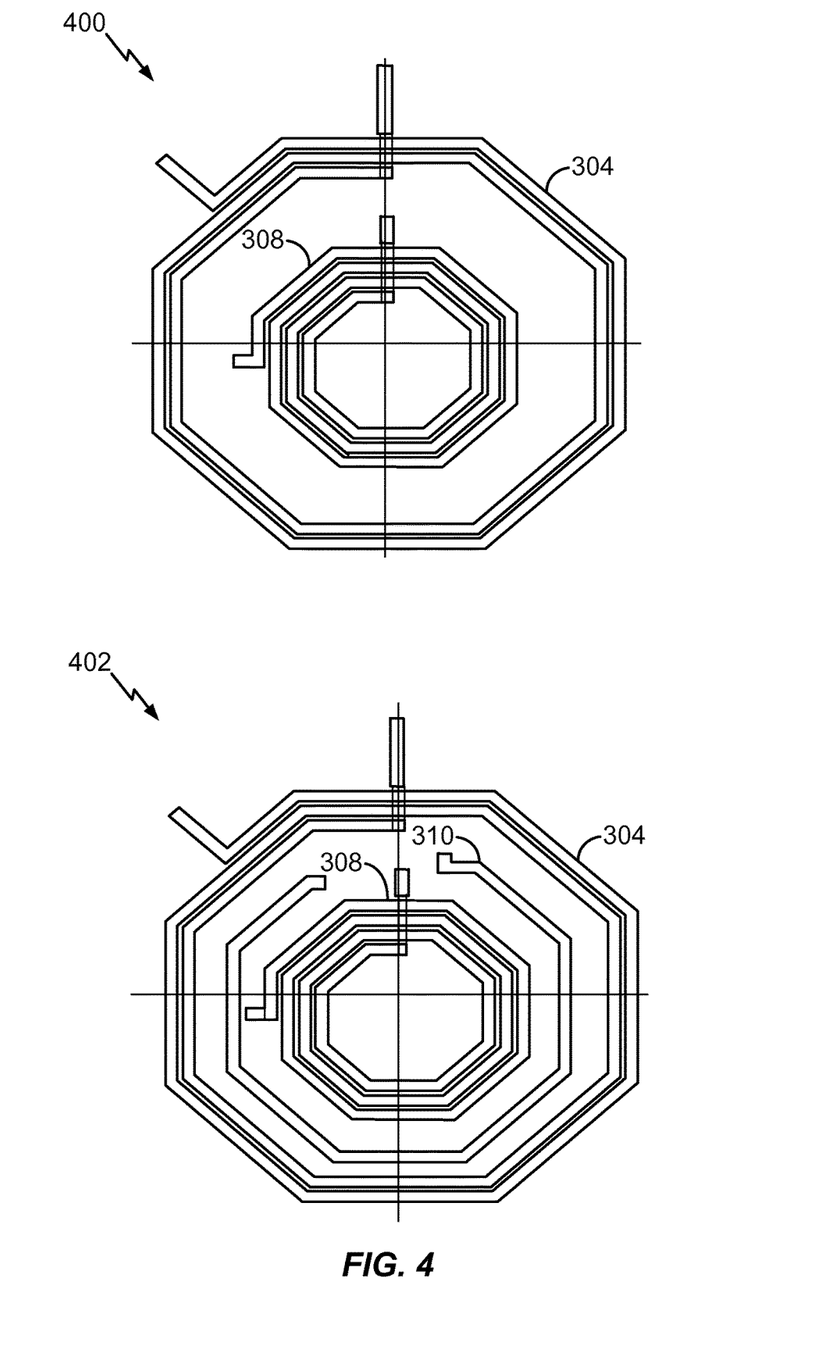
FIG. 4 illustrates circuit layouts of inductive coupling associated with the dual-band matching network of FIG. 3.

Referring to FIG. 4, a first circuit layout 400 of the inductor 304 and the inductor 308 is shown. The first circuit layout 400 enables inductive coupling between the inductor 304 and the inductor 308.

Referring back to FIG. 3, the capacitor 306 may mitigate the coupling impact of the forward reflection coefficient (S11) due to the inductive coupling. As a non-limiting example, the capacitance of the capacitor 306 may shift the noise figure of the LNA 240pk below −10 decibels (dBs) in the presence of the inductive coupling to improve input impedance matching for 5.6 GHz frequency band components of the input RF signal 294pk (e.g., improve S11 for signals in the 5.6 GHz frequency band).

An output of the dual-band matching network 301 may be coupled to the gate of the transistor 312. The transistor 312 may be an n-type metal oxide semiconductor (NMOS) transistor. A source of the transistor 312 may be coupled to a first terminal of an inductor 310 (e.g., a degeneration inductor), and a second terminal of the inductor 310 may be coupled to ground. In an exemplary embodiment, the dual-band matching network 301 and the inductor 310 may provide input impedance matching between the LNA 240pk and the antenna interface circuit 224 of FIG. 2.

Referring to FIG. 4, a second circuit layout 402 of the inductor 304, the inductor 308, and the inductor 310 is shown. The second circuit layout 402 enables inductive coupling between the inductor 304, the inductor 308, and the inductor 310. The inductive coupling in the second circuit layout 402 may reduce die area consumption compared to conventional dual-mode low noise amplifier architectures that utilize a relatively long inductance bonding wire.

Referring back to FIG. 3, a drain of the transistor 312 may be coupled to a source of a transistor 314 such that the amplification circuitry 300 corresponds to a pair of cascoded transistors 312, 314. The transistor 314 may be an NMOS transistor. The transistors 312, 314 may be configured to amplify an output of the dual-band matching network 301. For ease of illustration, the output of the dual-band matching network 301 is referred to as the input RF signal 294pk. However, in actual implementation, portions of the input RF signal 294pk may be filtered by the dual-band matching network 301 to generate an impedance matched version of the input RF signal 294pk. The input RF signal 294pk (e.g., the impedance matched version of the input RF signal 294pk) may include first signal components within the first frequency band (e.g., a 2.4 GHz frequency band) and the second signal components within the second frequency band (e.g., a 5.6 GHz frequency band). Based on tuning circuitry 315 (LC circuitry), the transistors 312, 314 may amplify the first signal components of the input RF signal 294pk, the second signal components of the input RF signal 294pk, or a combination of the first and second signal components of the input RF signal 294pk, as described below.

The tuning circuitry 315 may be configured to resonate within the first frequency band (e.g., the 2.4 GHz frequency band), to resonate within the second frequency band (e.g., the 5.6 GHz frequency band), or to concurrently resonate in the first and second frequency bands. The tuning circuitry 315 includes an inductor 316, an inductor 318, a capacitor 320, an inductor 322, a capacitor 324, a tunable capacitor bank 330, and a tunable capacitor bank 334. The tuning circuitry 315 also includes a transistor 326, a transistor 328, and a transistor 332. In an exemplary embodiment, the transistors 326, 328, 332 may be NMOS transistors. As described below, the transistors 326, 328, 332 may be responsive to control signals (e.g., a 2.4 GHz enable signal (EN_2G) or a 5.6 GHz enable signal (EN_5G)) to operate the tuning circuitry 315 within the first frequency band (e.g., the 2.4 GHz frequency band), to operate the tuning circuitry 315 within the second frequency band (e.g., the 5.6 GHz frequency band), or to concurrently operate the tuning circuitry 315 in the first and second frequency bands. In an exemplary embodiment, the control signals may correspond to the control signal 298pk received from the control circuitry 284 of FIG. 2.

A first terminal of the inductor 316 may be coupled to a drain of the transistor 314, and a second terminal of the inductor 316 may be coupled to a first terminal of the inductor 318. The inductor 316 may be inductively coupled to the inductor 318 by a coupling coefficient (k2) to form a pair of differential inductors (e.g., a pair of inductors having three terminals). For example, a node 350 (e.g., a terminal) between the inductors may be "tapped" by a supply voltage (Vdd). A first terminal of the capacitor 320 may be coupled to the first terminal of the inductor 316, and a second terminal of the capacitor 320 may be coupled to a first terminal of the inductor 322. A second terminal of the inductor 322 may be coupled to a first terminal of the capacitor 324, and a second terminal of the capacitor 324 may be coupled to a second terminal of the inductor 318. As described below, the pair of differential inductors may support switching between the first frequency band and the second frequency band as opposed to a single-ended inductor that does not support switching between the first and second frequency bands. In addition, the pair of differential inductors provides a differential output.

A source of the transistor 326 may be coupled to the first terminal of the capacitor 320, and a drain of the transistor 326 may be coupled to a first terminal of the tunable capacitor bank 330. A gate of the transistor 326 may be coupled to receive the 5.6 GHz enable signal (EN_5G). A second terminal of the tunable capacitor bank 330 may be coupled to a source of the transistor 328, and a drain of the transistor 328 may be coupled to the second terminal of the capacitor 324. A gate of the transistor 328 may be coupled to receive the 5.6 GHz enable signal (EN_5G).

A source of the transistor 332 may be coupled to the first terminal of the inductor 322, and a drain of the transistor 332 may be coupled to the second terminal of the inductor 322. A gate of the transistor 332 may be coupled to receive the 2.4 GHz enable signal (EN_2G). A first terminal of the tunable capacitor bank 334 may be coupled to the source of the transistor 326, and a second terminal of the tunable capacitor bank 334 may be coupled to the drain of the transistor 328.

To operate the tuning circuitry 315, and the LNA 240pk, in the first frequency band (e.g., the 2.4 GHz frequency band), the 2.4 GHz enable signal (EN_2G) may be set at a logical high voltage level, and the 5.6 GHz enable signal (EN_5G) may be set at a logical low voltage level. As used herein, the logical high voltage level may be approximately equal to twice the supply voltage (2*Vdd), and the logical low voltage level may be approximately equal to ground. The logical high voltage level of the 2.4 GHz enable signal (EN_2G) may turn on the transistor 332, and the logical low voltage level of the 5.6 GHz enable signal (EN_5G) may turn off the transistors 326, 328. Thus, the transistor 332 may "short circuit" the inductor 322. Additionally, the transistors 326, 328 may operate to decouple (e.g., "open circuit") the tunable capacitor bank 330. For example, the transistors 326, 328 may substantially inhibit current propagation to the tunable capacitor bank 330. Shorting the inductor 322 and decoupling the tunable capacitor bank 330 may adjust the resonating frequency of the tuning circuitry 315 to approximately 2.4 GHz. For example, during operation in the first frequency band, the active components in the tuning circuitry 315 may include the inductor 316, the inductor 318, the capacitor 320, the capacitor 324, and the tunable capacitor bank 334, and such components may be selected and sized such that the tuning circuitry 314 resonates at approximately 2.4 GHz.

To operate the tuning circuitry 315 in the second frequency band (e.g., the 5.6 GHz frequency band), the 5.6 GHz enable signal (EN_5G) may be set at a logical high voltage level, and the 2.4 GHz enable signal (EN_2G) may be set at a logical low voltage level. The logical high voltage level of the 5.6 GHz enable signal (EN_5G) turns on the transistors 326, 328, and the logical low voltage level of the 2.4 GHz enable signal (EN_2G) turns off the transistor 332. Thus, the transistor 332 may decouple (e.g., open circuit) the capacitors 320, 324 to adjust the resonating frequency of the tuning circuitry 315 to approximately 5.6 GHz. For example, the active components in the tuning circuitry 315 during operation in the second frequency band may include the inductor 316, the inductor 318, the inductor 322, the tunable capacitor bank 330, and the tunable capacitor bank 334, and such components may be selected and sized such that the tuning circuitry 315 resonates at approximately 5.6 GHz.

To simultaneously operate the tuning circuitry 315 in the first frequency band and the second frequency band, the 2.4 GHz enable signal (EN_2G) may be set at a logical low voltage level, and the 5.6 GHz enable signal (EN_5G) may be set at a logical low voltage level. The logical low voltage levels may turn off the transistors 326, 328, 332 to cause the tuning circuitry 315 to resonate at approximately 2.4 GHz and to resonate at approximately 5.6 GHz. For example, the active components in the tuning circuitry 315 during simultaneous dual-band operation may include the inductor 316, the inductor 318, the capacitor 320, the inductor 322, the capacitor 324, the tunable capacitor bank 330, and the tunable capacitor bank 334, and such components may be selected and sized such that tuning circuitry 315 resonates at approximately 2.4 GHz and 5.6 GHz.

When the tuning circuitry 315 operates within the first frequency band, the second signal components (e.g., the 5.6 GHz signal components) of the input RF signal 294pk are filtered, and the transistors 312, 314 amplify the first signal components (e.g., the 2.4 GHz signal components) of the input RF signal 294pk to generate the output RF signal 296pk (e.g., a differential output signal). For example, the tuning circuitry 315 may resonate at approximately 2.4 GHz and may filter the high frequency signal components (e.g., the 5.6 GHz signal components). When the tuning circuitry 315 operates within the second frequency band, the first signal components of the input RF signal 294pk are filtered, and the transistors 312, 314 amplify the second signal components of the input RF signal 294pk to generate the output RF signal 296pk. For example, the tuning circuitry 315 may resonate at approximately 5.6 GHz and may filter the low frequency signal components (e.g., the 2.4 GHz signal components). When the tuning circuitry 315 operates in the simultaneous dual-band mode, the transistors 312, 314 amplify the first and second signal components of the input RF signal 294pk to generate the output RF signal 296pk (having both 2.4 GHz and 5.6 GHz components) in the dual-band mode.

The receive circuits 242pk may be coupled to receive the output RF signal 296pk. The receive circuits 242pk may include a transconductance (Gm) cell 336, a transconductance (Gm) cell 338, a 5.6 GHz mixer 340, and a 2.4 GHz mixer 342. The transconductance cell 336 may be coupled to the 5.6 GHz mixer 340, and the transconductance cell 338 may be coupled to the 2.4 GHz mixer 342. The transconductance cell 336 may be responsive to the control signal 298pk to pass the output RF signal 296pk to the 5.6 GHz mixer 340 when the tuning circuitry 315 operates within the second frequency band or operates in the dual-band mode. The transconductance cell 338 may be responsive to the control signal 298pk to pass the output RF signal 296pk to the 2.4 GHz mixer 342 when the tuning circuitry 315 operates within the first frequency band or operates in the dual-band mode. The mixers 340, 342 may mix the output RF signal 296pk with local oscillator signals and provide resulting signals to other components (not shown) of the receive circuits 242pk.

The LNA 240pk may enable dual-band operation within the 2.4 GHz frequency band and the 5.6 GHz frequency band. For example, use of the differential inductors 316, 318 having the coupling coefficient (k2) may enable switching between the first frequency band and the second frequency band. Additionally, the differential inductors 316, 318 may be used with the tuning circuitry 315 to convert a single-ended signal into a differential signal (e.g., the output RF signal 296pk). Converting the single-ended signal (from amplification circuit 300) into the differential signal may reduce substrate noise and may reduce second order distortion. Inductively coupling the inductors 304, 308 by the coupling coefficient (k1) may also reduce die area. In an exemplary embodiment, the inductor 310 may also be inductively coupled to the inductors 304, 308 (e.g., by the second circuit layout 402 of FIG. 4) to further reduce die area consumption. Dual-band operation may be used by systems that comply with Institute of Electrical and Electronic Engineers (IEEE) 802.11 ("WiFi") standards for wireless local area networks (WLANs). For example, 2G WiFi signals (e.g., the 2.4 GHz signal components) may be amplified by the LNA 240pk and 5G WiFi signals (e.g., the 5.6 GHz signal components) may be amplified by the LNA 240pk.

Figure 5:
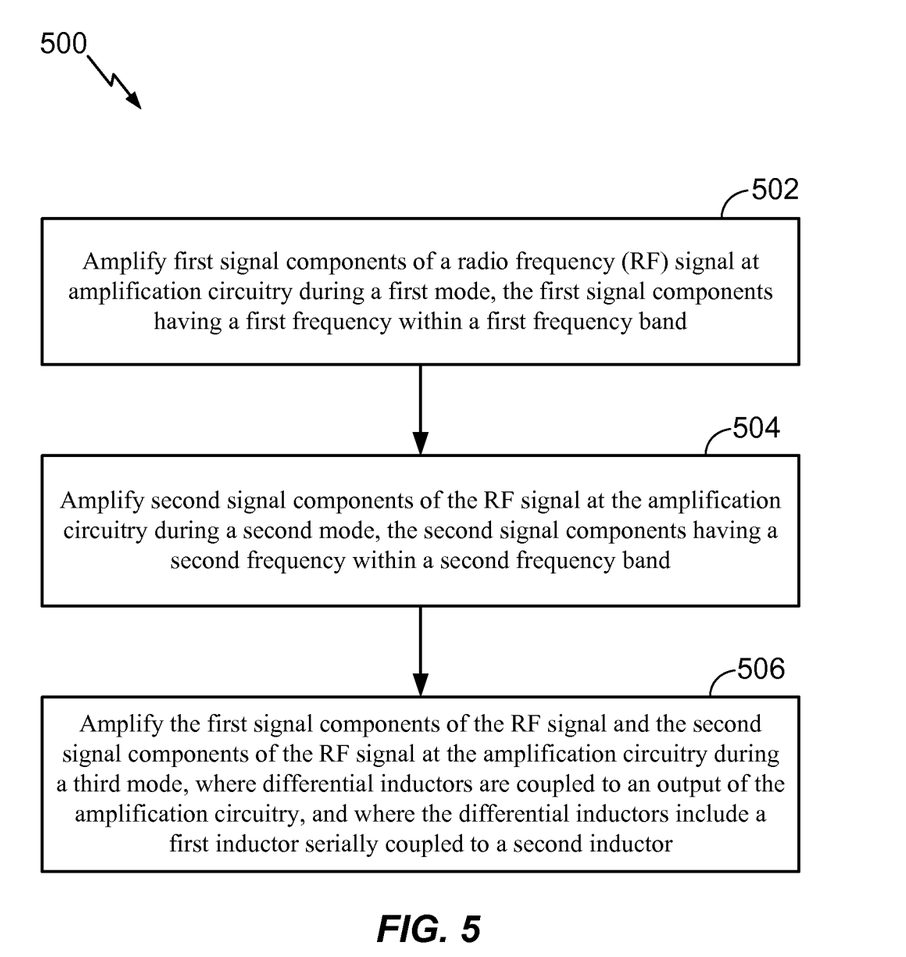
FIG. 5 is a flowchart that illustrates an exemplary embodiment of a method of operating a dual-band low noise amplifier in multiple modes.

Referring to FIG. 5, a flowchart illustrates an exemplary embodiment of a method 500 of operating a dual-band low noise amplifier in multiple modes. In an exemplary embodiment, the method 500 may be performed using the wireless device 110 of FIGS. 1-2, the dual-band low noise amplifier 240pk of FIGS. 2-3, or any combination thereof.

The method 500 includes receiving a control signal at tuning circuitry in a low noise amplifier, at 502. For example, referring to FIG. 3, the tuning circuitry 315, or a portion of the tuning circuitry 315, may receive a control signal (e.g., the 2.4 GHz enable signal (EN_2G) and/or the 5.6 GHz enable signal (EN_5G)). The tuning circuitry 315 includes differential inductors that are serially coupled (e.g., the inductor 316 and the inductor 318).

An impedance of the tuning circuitry may be adjusted based on the control signal to operate the low noise amplifier in a first frequency band, in a second frequency band, or in the first frequency band and in the second frequency band, at 504. For example, referring to FIG. 3, the 2.4 GHz enable signal (EN_2G) may be set at a logical high voltage level during a first mode of operation, and the 5.6 GHz enable signal (EN_5G) may be set at a logical low voltage level during the first mode of operation. As a result, the impedance of the tuning circuitry 315 may be adjusted and the low noise amplifier 240pk may be tuned to the first frequency band (e.g., the 2.4 GHz frequency band) and the amplification circuitry 300 may amplify 2.4 GHz signal components of an impedance matched version of the input RF signal 294pk.

As another example, the 5.6 GHz enable signal (EN_5G) may be set at a logical high voltage level during a second mode of operation, and the 2.4 GHz enable signal (EN_2G) may be set at a logical low voltage level during the second mode of operation. As a result, the impedance of the tuning circuitry 315 may be adjusted and the low noise amplifier 240pk may be tuned to the second frequency band (e.g., the 5.6 GHz frequency band) and the amplification circuitry 300 may amplify 5.6 GHz signal components of the impedance matched version of the input RF signal 294pk.

As another example, the 2.4 GHz enable signal (EN_2G) may be set at a logical low voltage level during a third mode of operation, and the 5.6 GHz enable signal (EN_5G) may be set at a logical low voltage level during the third mode of operation. As a result, the impedance of the tuning circuitry 315 may be adjusted and the low noise amplifier 240pk may be tuned to the first frequency band and to the second frequency band (e.g., the tuning circuitry 315 may resonate at 2.4 GHz and at 5.6 GHz) and the amplification circuitry 300 may amplify the 2.4 GHz signal components and the 5.6 GHz signal components of the impedance matched version of the input RF signal 294pk. The differential inductors 316, 318 may be coupled to the output of the amplification circuitry 300. The differential inductors 316, 318 may support switching between the first frequency band and the second frequency band as opposed to a single-ended inductor that does not support switching between the first and second frequency bands.

The method 500 of FIG. 5 may enable dual-band operation within the 2.4 GHz frequency band and the 5.6 GHz frequency band. Additionally, the differential inductors 316, 318 may be used with the tuning circuitry 315 to convert a single-ended signal into a differential signal (e.g., the output RF signal 296pk). Converting the single-ended signal (from amplification circuit 300) into the differential signal may reduce substrate noise and may reduce second order distortion. Inductively coupling the inductors 304, 308 by the coupling coefficient (k1) may also reduce die area. In an exemplary embodiment, the inductor 310 may also be inductively coupled to the inductors 304, 308 (e.g., by the second circuit layout 402 of FIG. 4) to further reduce die area consumption. Dual-band operation may be used by systems that comply with WiFi standards for WLANs. For example, 2G WiFi signals (e.g., the 2.4 GHz signal components) may be amplified by the LNA 240pk and 5G WiFi signals (e.g., the 5.6 GHz signal components) may be amplified by the LNA 240pk.

In conjunction with the described embodiments, an apparatus includes means for amplifying a radio frequency (RF) signal. For example, the means for amplifying may include the transistor 312 of FIG. 3, the transistor 314 of FIG. 3, one or more other devices, circuits, or any combination thereof.

The apparatus may also include means for filtering the RF signal and for providing a differential output. The means for filtering the RF signal and for providing the differential output may include differential inductors coupled to an output of the means for amplifying. The differential inductors may include a first inductor serially coupled to a second inductor. For example, the means for filtering the RF signal and for providing the differential output may include the differential inductors 316, 318 of FIG. 3, one or more other devices, circuits, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising: amplification circuitry configured to amplify a radio frequency (RF) signal; differential inductors coupled to an output of the amplification circuitry, the differential inductors including a first inductor serially coupled to a second inductor, the differential inductors configured to filter the RF signal and to provide a differential output, wherein the amplification circuitry and the differential inductors are included in a low noise amplifier;
   at least one impedance element decoupled from the differential inductors, wherein the at least one impedance element is in a second path in parallel with a first path that includes the differential inductors; and an inductor in a third path in parallel with the first path.

2. The apparatus of claim 1, wherein the differential inductors are included in tuning circuitry that is controllable to concurrently resonate at a first frequency within a first frequency band and at a second frequency within a second frequency band.

3. The apparatus of claim 1, wherein the differential inductors are included in tuning circuitry, and wherein the impedance element is decouplable from the differential inductors to adjust an impedance of the tuning circuitry.

4. The apparatus of claim 1, wherein the amplification circuitry includes a pair of cascoded transistors.

5. An apparatus comprising:
   amplification circuitry configured to amplify a radio frequency (RF) signal; and
   tuning circuitry comprising:

differential inductors coupled to an output of the amplification circuitry, the differential inductors including a first inductor serially coupled to a second inductor, the differential inductors configured to filter the RF signal and to provide a differential output;

a first capacitor coupled to the first inductor;

a second capacitor coupled to the second inductor;

a third inductor coupled to the first capacitor and coupled to the second capacitor;

a first transistor coupled to the third inductor;

a second transistor coupled to the first inductor; and a third transistor coupled to the second inductor.

6. The apparatus of claim 5, wherein the tuning circuitry is controllable to resonate at a frequency within a first frequency band, at a frequency within a second frequency band, or at the frequency within the first frequency band and at the frequency within the second frequency band, and wherein the tuning circuitry is configured to resonate at the frequency within the first frequency band.

7. The apparatus of claim 5, further comprising:

a tunable capacitor bank coupled to the second transistor and coupled to the third transistor, the tuning circuitry configured to resonate at a frequency within a second frequency band based on the second transistor and the third transistor being activated by a second control signal and the tuning circuitry configured to concurrently resonate at a frequency within a first frequency band and at a frequency within the second frequency band based on a first control signal deactivating the first transistor and the second control signal deactivating the second transistor and the third transistor.

8. An apparatus comprising:

amplification circuitry configured to amplify a radio frequency (RF) signal;

differential inductors coupled to an output of the amplification circuitry, the differential inductors including a first inductor serial coupled to a second inductor the differential inductors configured to filter the RF signal and to provide a differential output;

at least one impedance element in parallel with and decouplable from the differential inductors; and a dual-band matching network coupled to the amplification circuitry, the dual-band matching network comprising a third inductor and a fourth inductor.

9. The apparatus of claim 8, wherein the third inductor circumscribes the fourth inductor.

10. The apparatus of claim 8, wherein the amplification circuitry includes a transistor, and further comprising a degeneration inductor coupled to the transistor and coupled to ground.

11. The apparatus of claim 10, wherein the third inductor circumscribes the degeneration inductor.

12. An apparatus comprising:

means for amplifying signal components of a radio frequency (RF) signal;

means for filtering the RF signal and for providing a differential output, the means for filtering the RF signal and for providing the differential output including differential inductors coupled to an output of the means for amplifying, the differential inductors including a first inductor serially coupled to a second inductor, wherein the means for filtering the RF signal and for providing the differential output further comprises first means for storing energy coupled to the first inductor, second means for storing energy coupled to the second inductor, and a third inductor coupled to the first means for storing energy and coupled to the second means for storing energy; and means for generating an impedance in parallel with and decouplable from the means for filtering the RF signal and for providing the differential output.

13. The apparatus of claim 12, wherein the differential inductors are included in tuning circuitry that includes first means for switching configured to selectively cause the tuning circuitry to resonate at a first frequency within a first frequency band and second means for switching configured to selectively cause the tuning circuitry to resonate at a second frequency within a second frequency band, wherein the first means for switching and the second means for switching are further configured to selectively cause the tuning circuitry to resonate at the first frequency within the first frequency band and at the second frequency within the second frequency band.

14. The apparatus of claim 12, wherein the means for amplifying and the means for filtering the RF signal and for providing the differential output are included in a low noise amplifier.

15. The apparatus of claim 12, further comprising means for impedance matching coupled to the means for amplifying.

16. A method comprising:

receiving a control signal at tuning circuitry in a low noise amplifier, the tuning circuitry including differential inductors that include a first inductor serially coupled to a second inductor; and adjusting an impedance of the tuning circuitry based on the control signal to concurrently operate the low noise amplifier in a first frequency band and in a second frequency band, wherein adjusting the impedance of the tuning circuitry includes decoupling an impedance element that is connected in parallel with the differential inductors, wherein the impedance element is decoupled by deactivating a first transistor coupled to a first node of the impedance element and deactivating a second transistor coupled to a second node of the impedance element.

17. The method of claim 16, wherein the first frequency band is a 2.4 gigahertz (GHz) frequency band, and wherein the second frequency band is a 5.6 GHz frequency band.

* * * * *